(12) United States Patent
Wagner et al.

(10) Patent No.: US 11,050,411 B2
(45) Date of Patent: Jun. 29, 2021

(54) WIDEBAND FILTER STRUCTURE AND APPARATUS, RADIO TRANSCEIVER, MOBILE TERMINAL, METHOD FOR FILTERING A RADIO SIGNAL

(71) Applicant: Intel IP Corporation, Santa Clara, CA (US)

(72) Inventors: Michael Wagner, Unterhaching (DE); Stephan Leuschner, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/474,563

(22) PCT Filed: Mar. 31, 2017

(86) PCT No.: PCT/US2017/025278
§ 371 (c)(1),
(2) Date: Jun. 28, 2019

(87) PCT Pub. No.: WO2018/182671
PCT Pub. Date: Oct. 4, 2018

(65) Prior Publication Data
US 2020/0021274 A1     Jan. 16, 2020

(51) Int. Cl.
*H03H 9/54*     (2006.01)
*H03H 7/01*     (2006.01)
(Continued)

(52) U.S. Cl.
CPC .......... *H03H 9/542* (2013.01); *H03H 7/1783* (2013.01); *H03H 7/1791* (2013.01);
(Continued)

(58) Field of Classification Search
CPC .... H03H 9/605; H03H 7/1783; H03H 7/1791; H03H 9/02007; H03H 9/545;
(Continued)

(56) References Cited

U.S. PATENT DOCUMENTS 7,994,877 B1    8/2011    Kubena et al.
2012/0108167 A1    5/2012    Erb
(Continued)

OTHER PUBLICATIONS

Robert Aigner, "SAW and BAW Technologies for RF Filter Applications: A Review of the Relative Strengths and Weaknesses," 2008 IEEE International Ultrasonics Symposium Proceedings (pp. 582-589, Dec. 2008).
(Continued)

*Primary Examiner* — Robert J Pascal
*Assistant Examiner* — Jorge L Salazar, Jr.
(74) *Attorney, Agent, or Firm* — 2SPL Patent Attorneys PartG mbB; Kieran O'Leary

(57) ABSTRACT

Examples provide a wideband filter structure and apparatus, a radio transceiver, a mobile terminal, and a method for filtering a radio signal. The wideband filter structure (10) for a radio signal comprises a combination of at least one acoustic resonator (12) and at least one analog resonator (14). The acoustic resonator (12) is coupled to the analog resonator (14). The wideband filter structure (10) comprises a further component (16), which is coupled to the combination of the acoustic resonator (12) and the analog resonator (14).

19 Claims, 11 Drawing Sheets

(51) Int. Cl.
*H03H 9/02* (2006.01)
*H03H 9/60* (2006.01)

(52) U.S. Cl.
CPC ........ *H03H 9/02007* (2013.01); *H03H 9/545* (2013.01); *H03H 9/605* (2013.01)

(58) Field of Classification Search
CPC .... H03H 7/1766; H03H 7/175; H03H 7/1758; H03H 9/542; H03H 9/6483; H03H 7/1775
USPC ................. 333/133, 186, 187, 188, 193–196
See application file for complete search history.

(56) References Cited

U.S. PATENT DOCUMENTS

| | | | | |
|---|---|---|---|---|
| 2015/0137908 | A1* | 5/2015 | Nishihara | H03H 9/02834 333/133 |
| 2016/0105158 | A1 | 4/2016 | Fujiwara et al. | |
| 2016/0294423 | A1 | 10/2016 | Yatsenko et al. | |
| 2017/0093365 | A1* | 3/2017 | Xu | H03H 9/6433 |
| 2017/0093374 | A1 | 3/2017 | Yatsenko et al. | |

OTHER PUBLICATIONS

Mercedes Jimenez Blasco, "A Coupling Matrix Vision of Mobile Filtering Devices with Micro-acoustic Wave Technologies. A Systematic Approach," Universitat Autonoma de Barcelona (Jul. 2015).

Thomas Baron et al. "Wideband Lithium Niobate FBAR Filters," International Journal of Microwave Science and Technology (vol. 2013, 2013).

Dimitria Psychogiou et al.: "Hybrid Acoustic-Wave-Lumped-Element Resonators (AWLRs) for High-Q Bandpass Filters With Quasi-Elliptic Frequency Response," IEEE Transactions on Microwave Theory and Techniques (vol. 63, No. 7, pp. 2233-2244, Jul. 7, 2015).

Humberto Campanella, "Acoustic Wave and Electromechanical Resonators: Concept to Key Applications", Artech House, (pp. 83-86 Jan. 30, 2010).

Andreas Link and Phil Warder, "Golden Age for Filter Design: Innovative and Proven Approaches for Acoustic Filter, Duplexer, and Multiplexer Design," IEEE Microwave Magazine (vol. 16, No. 7, pp. 60-72, Jul. 10, 2015).

* cited by examiner a)

b)

WIDEBAND FILTER STRUCTURE AND APPARATUS, RADIO TRANSCEIVER, MOBILE TERMINAL, METHOD FOR FILTERING A RADIO SIGNAL

FIELD

Examples relate to a wideband filter structure and apparatus, a radio transceiver, a mobile terminal, and a method for filtering a radio signal, and in particular, but not exclusively, to a concept and mechanism for filtering a radio signal using an acoustic resonator coupled to an analog resonator.

BACKGROUND

With the growing demand for wireless services, Radio Frequency (RF) circuits become more and more versatile. For example, the number of wireless access technologies and the frequency range in which mobile communication systems are active are growing, wherein a physical size and power consumption of RF units is decreasing. For example, $5^{th}$ Generation (5G) system may operate using mm-wave technology. RF circuit components such as resonators, filters, amplifiers, antennas, diplexers, duplexers, etc. are designed for such high frequency and broad bandwidth applications.

Duplex filters for $3^{rd}$ Generation (3G) and $4^{th}$ Generation (4G) mobile handsets today may rely on the superior insertion loss and selectivity of Surface Acoustic Wave (SAW), Bulk Acoustic Wave (BAW) and Film BAR (FBAR) acoustic resonators. The maximum effective bandwidth of such filters may be limited by material properties of the piezoelectric materials: An electromechanical coupling factor $k_t^2$ of available materials may range from 7.5% (maximum for AlN, Aluminum Nitride) to 31% (LiNbO3, Lithium Niobate even up to 53% possible) and allows fractional filter bandwidths of 4% to 16%.

Generally, the achievable fractional bandwidth may depend on $k_t^2$ and may be in the range of 0.4-0.8 $k_t^2$. Future 5G systems are expected to have considerably larger RF bandwidths of >>100 MHz in the 3 . . . 6 GHz range (even approaching 1 GHz!), as well as very high signal bandwidths (channel bandwidths of 100 MHz and beyond in combination with carrier aggregation). Potential filter solutions for Frequency-Division Duplex (FDD) systems are challenging because of the aforementioned bandwidth limitations of piezoelectric filters and high insertion loss of LC filters (analog filters using Inductances (L) and Capacitors (C)). Also in Time-Division Duplex (TDD) based systems, requirements on selectivity and stop-band suppression in coexistence scenarios (e.g. with Wireless Fidelity (WiFi)) may be very demanding.

Further information can be found in

Aigner, R.: "SAW and BAW Technologies for RF Filter Applications: A Review of the Relative Strengths and Weaknesses", IEEE Ultrasonics Symposium, IEEE, 2008, 582-589, Jimenez Blasco, M.: "A Coupling Matrix Vision for Mobile Filtering Devices with Micro-acoustic Wave Technologies. A Systematic Approach", Universitat Autónoma de Barcelona, 2015, Baron, T. et al.: "Wideband Lithium Niobate FBAR Filters International Journal of Microwave Science and Technology", 2013, Psychogiou, D. et al.: "Hybrid Acoustic-Wave-Lumped-Element Resonators (AWLRs) for High-Q Bandpass Filters With Quasi-Elliptic Frequency Response", IEEE Transactions on Microwave Theory and Techniques, IEEE, 2015, 63, 2233-2244, Lu, X. et al.: "Wideband Bandpass Filters with SAW-Filter-Like Selectivity Using Chip SAW Resonators", IEEE Transactions on Microwave Theory and Techniques, IEEE, 2014, 62, 28-36, Campanella, H.: "Acoustic Wave and Electromechanical Resonators: Concept to Key Applications", Artech House, 2010, and Link, A. & Warder, P.: "Golden Age for Filter Design: Innovative and Proven Approaches for Acoustic Filter, Duplexer, and Multiplexer Design", IEEE Microwave Magazine, 2015, 16, 60-72.

BRIEF DESCRIPTION OF THE FIGURES

Some examples of circuits, apparatuses, methods and/or computer programs will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
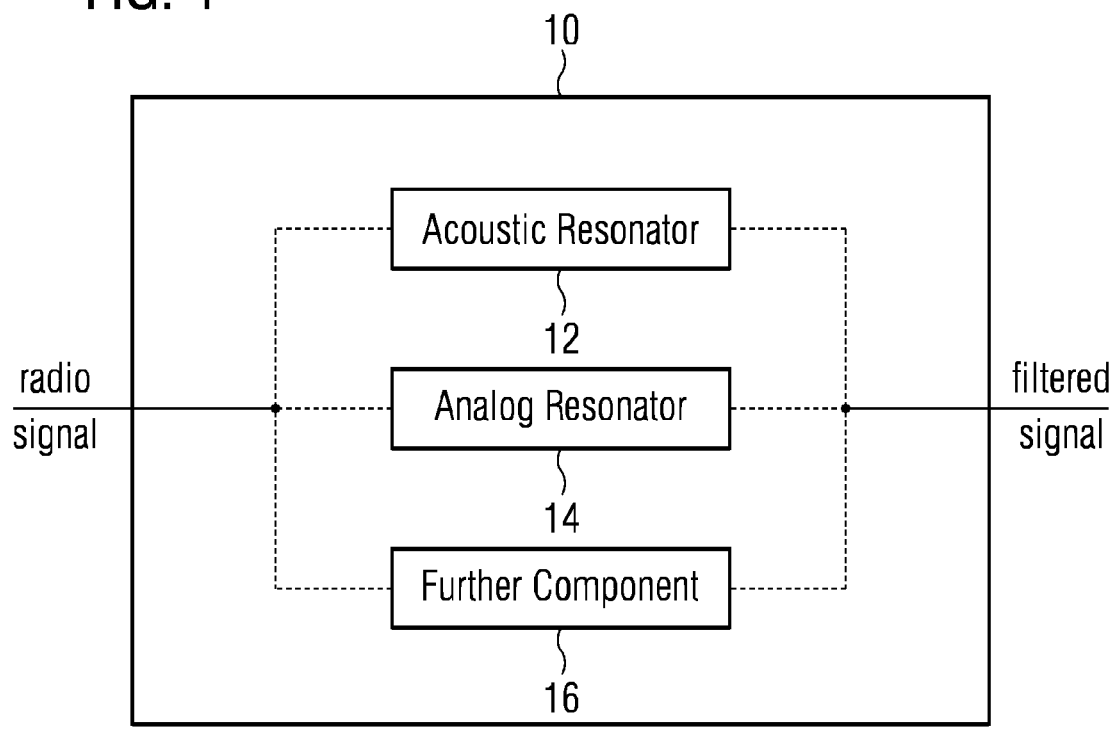
FIG. 1 illustrates an example of a wideband filter structure and apparatus.

Examples are based on the finding that radio signal filtering can be carried out using a combination of an acoustic resonator, an analog resonator and a further component. Examples of such a hybrid filter approach may provide improved filter characteristics by combining the wide bandwidth achievable with LC resonators/filters and the high selectivity of acoustic wave resonators or filters. FIG. 1 illustrates an example of a wideband filter structure or apparatus. FIG. 1 shows a wideband filter structure or apparatus 10 for a radio signal comprising a combination of at least one acoustic resonator 12 and at least one analog resonator 14, wherein the acoustic resonator 12 is coupled to the analog resonator 14, wherein the wideband filter structure 10 comprises a further component 16, which is coupled to the combination of the acoustic resonator 12 and the analog resonator 14. The broken lines in FIG. 1 indicate that there are multiple possibilities of how the three components can be coupled to each other.

In examples the analog resonator 14 may be any means for analogically resonating 14 (generate an analog resonating/oscillating signal). For example the analog resonator 14 may be a circuit, which comprises at least one capacitor and at least one inductor. Hence, the analog resonator 14 may be an analog resonator circuit comprising a capacitor, C, and an inductor, L, which can be in parallel or serial configuration. The further component 16 may comprise at least one of a capacitor or an inductor. In some examples the further component 16 may hence comprise a single capacitor, inductor, respectively. In other examples the further component 16 may comprises a network of one or more capacitors and/or one or more inductors, a combination thereof, respectively.

With the analog resonator 14, e.g. LC resonators/filters, generally a wide bandwidth can be achieved, but they may exhibit rather smooth roll-off at the passband edges/cut-off frequencies and therefore low attenuation near the passband when a filter order is limited. The insertion loss of an analog resonator 14 may be limited mainly by the quality factors of the used inductances.

In examples the acoustic resonator 12 may correspond to one of or a combination of the elements of the group of any means for acoustically resonating, a surface acoustic wave resonator, a bulk acoustic wave resonator, a crystal resonator, or a film bulk acoustic wave resonator. For example, there may be two or more resonators in a filter depending on a desired frequency response and quality of the filter.

In examples, the acoustic resonator 14 may comprise acoustic resonators like e.g. SAW, BAW or FBAR, which may exhibit sharp cut-offs at the passband edges/cut-off frequencies with high attenuation, but their bandwidth may be limited by the used material and its respective electro-mechanical coupling factor ($k_t^2$). Examples may implement a hybrid filter approach as a combination of LC and AW resonators/filters 12, 14 and may have a filter characteristic according to one or more elements of the group of a duplexer, a diplexer, a multiplexer, a low-pass, a high-pass, a bandpass, a bandstop, or an allpass.

Examples may show that when allowing asymmetric transmission behavior over frequency, combinations of acoustic resonators of moderate quality and integrated passive elements can be used to combine their respective advantages. These may include low insertion loss with a steep filter skirt on one side of the passband, high stopband suppression near the passband on that side and a wide bandwidth (fractional bandwidth>12%). Furthermore, the achievable bandwidth might no longer be restricted to the use of materials with a high coupling factor.

Examples may provide a higher bandwidth than an Acoustic-Wave-Lumped-Element Resonators (AWLR) using transmission lines. Examples may allow higher stopband suppression and may utilize less area or space as a number of inductances may be lower. Furthermore, examples may provide higher integration capability. Example may allow using a lower filter order for the analog resonator 12 compared to a filter order needed to achieve similar performance (same steepness of filter skirts) using a pure analog filter. Examples may use a lower count of inductances and lower transmission losses as compared to pure analog resonators/filters achieving similar performance. Some realizations of acoustic elements used in wide-bandwidth filter applications may be based on the usage of micro-strip coupled lines, which may be too long to be integrated on a chip at frequencies below 6 GHz. Approaches of using new materials for the acoustic resonators (e.g. LiNbO3) may be limited due to restricted integration capability into common processes.

Figure 2:
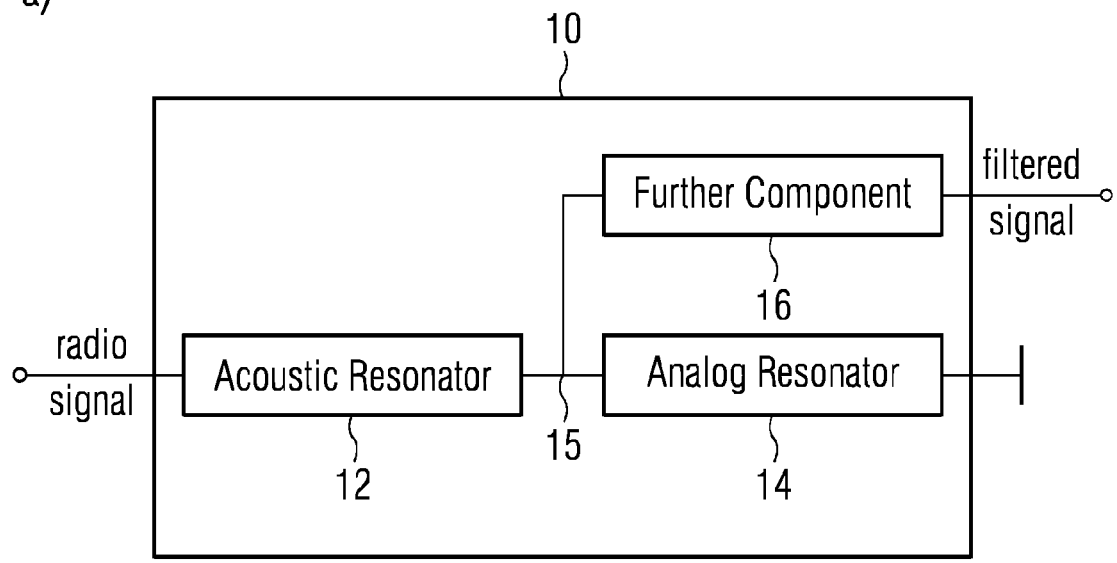
FIG. 2 shows further examples of wideband filter structures and apparatuses.
Figure 2:
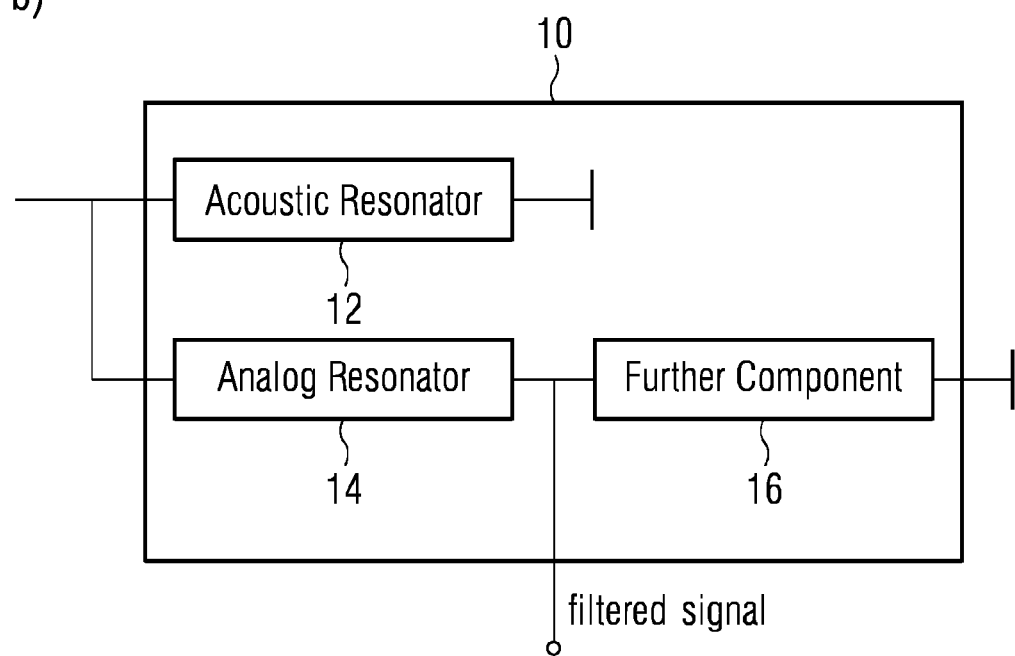

FIG. 2 shows further examples of wideband filter structures 10 and apparatuses 10. FIG. 2 illustrates two basic examples, which comprise an input for the radio signal and an output for a filtered radio signal, wherein the input is coupled to the acoustic resonator 12. It is to be noted, that in other examples the input may be coupled to the further component 16. From this perspective FIG. 2 a) shows a T-type configuration in which all three components, the acoustic resonator 12, the analog resonator 14, and the further component are coupled to a common point 15 in the center. The analog resonator 14 couples this point to a reference potential, e.g. to ground, while the other two, the acoustic resonator 12 and the further component 16, couple the input and output of the wideband filter structure to point 15. Hence, roles of the acoustic resonator 12 and the further component 16 can be exchangeable/they can be mirrored. In another example, the acoustic resonator 12 is an acoustic wave resonator coupled in series to the analog resonator 14. The acoustic resonator 12, the analog resonator 14 and the further component 16 form a T-type network. One of the acoustic resonator 12 and the further component 16 is coupled to an input of the wideband filter structure 10. The other one of the acoustic resonator 12 and the further component 16 is coupled to an output of the wideband filter structure 10.

In other examples the acoustic resonator 12 and the analog resonator 14 may be exchanged compared to the two examples shown in FIG. 2. At the top of FIG. 2, a), the analog resonator 14 is coupled to an output of the acoustic resonator 12, and the further component 16 is also coupled to the output of the acoustic resonator 12. The filtered signal is then available at an output of the further component 16 (in a mirrored example the filtered signal would be available at the output of the acoustic resonator 12, while the radio signal would be input into the further component 16). As can be seen from FIG. 2, a), the acoustic resonator 12 is operative without a parallel inductance, inductive network or impedance between an input of the acoustic resonator 12 and an output of the acoustic resonator 12. Compared to a circuit with a parallel inductance or inductive network, area or implementation space may be saved. From a certain perspective, the further component 16 may be considered in parallel to the analog filter 14, which is coupled to ground/reference potential in the example shown in FIG. 2, a).

As shown at the bottom of FIG. 2, b), in another example the analog resonator 14 is coupled to the input for the radio signal, and the further component 16 is coupled to an output of the analog resonator 14. In this example, the acoustic resonator 12 and the analog resonator 14 are somewhat parallel, where the further component 16 is coupled in series to the analog resonator 14. As already mentioned before, in further examples the acoustic resonator 12 and the analog resonator 14 may be exchanged. Further examples may use a mirrored configuration. FIG. 2 b) shows a pi-type configuration of the three components. The acoustic resonator 12 and the further component 16 are in shunt paths of the analog resonator 14 on both (opposite) sides. The input of the so-formed wideband filter structure 10 is between the acoustic resonator 12 and the analog resonator 14, an output for the filtered signal is between the analog resonator 14 and the further component 16. In a mirrored example input and output may change roles, i.e. an input of the so-formed mirrored wideband filter structure 10 is between the analog resonator 14 and the further component 16, an output for the filtered signal is between the acoustic resonator 12 and the analog resonator 14. The acoustic resonator 12 may be an acoustic wave resonator coupled in a shunt path of the analog resonator 14. The acoustic resonator 12, the analog resonator 14 and the further component 16 form a pi-type network. The acoustic resonator 12 and the analog resonator 14 are both coupled to one of an input or an output of the wideband filter structure 10.

Figure 3:
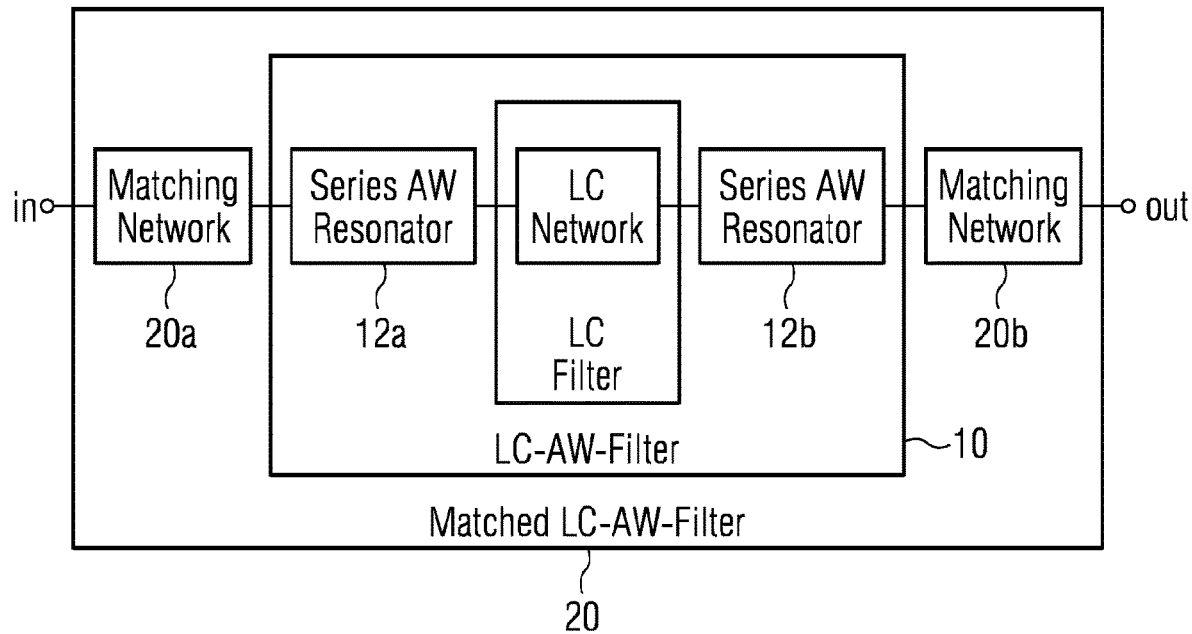
FIG. 3 depicts a further example of a wideband filter structure comprising a matching network.

FIG. 3 depicts a further example of a wideband filter structure 10 comprising matching networks 20a, 20b to implement a matched LC-AW-filter 20 as another example. As shown in FIG. 3 an input of the example of the matched LC-AW-filter 20 is coupled to a matching network 20a, the output of which is coupled to an input of a series AW resonator 12a. The output of the series AW resonator 12 is coupled to an LC network, which forms an LC-filter/resonator 14. An output of the LC resonator/filter 14 is coupled to an input of another series AW resonator 12b. An output of the other series AW resonator 12b is coupled to another matching network 20b matching an output impedance of the LC-AW-filter 20. The two series AW resonators 12a and 12b with the LC filter 14 in between form an example of the wideband filter structure 10. In this example, the further component 16 may be comprised in the series AW resonator 12b or in the matching network 20b.

Figure 4:
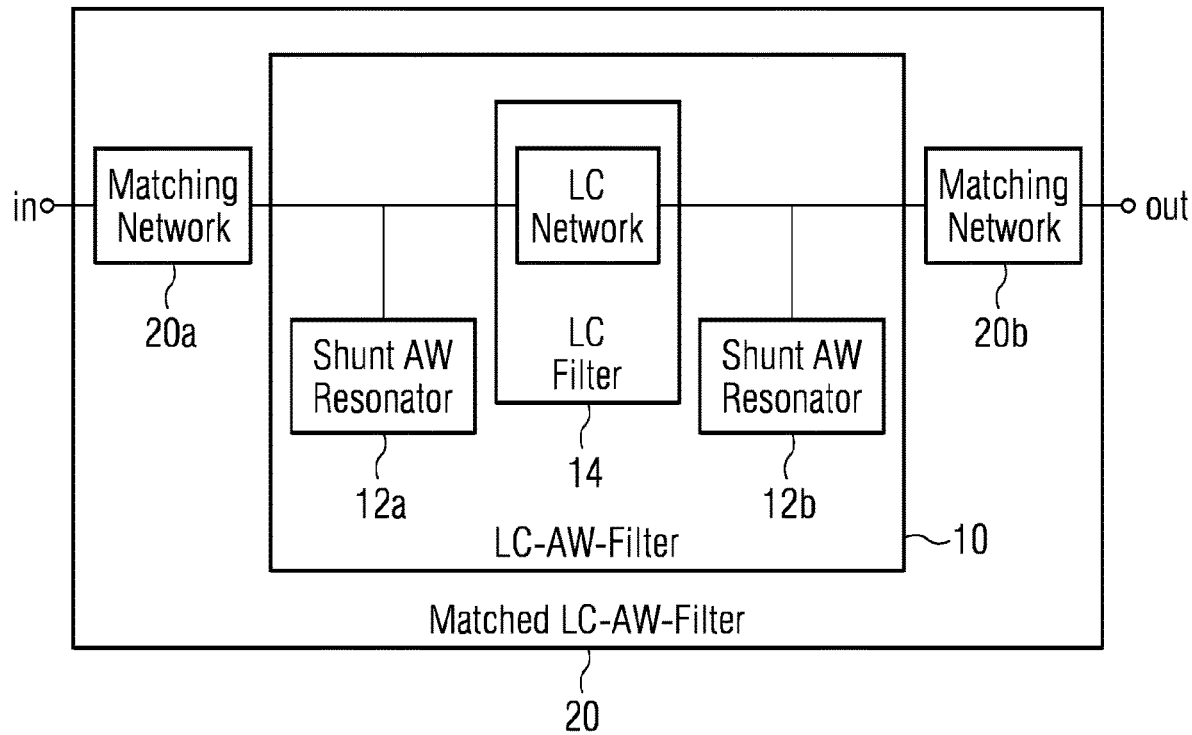
FIG. 4 depicts another example of a wideband filter structure comprising a matching network.

FIG. 4 depicts another example of a wideband filter structure 10 comprising matching networks 20a, 20b to implement a matched LC-AW-filter 20 as another example. As shown in FIG. 4 an input of the example of the matched LC-AW-filter 20 is coupled to a matching network 20a, the output of which in coupled to an input of a shunt AW resonator 12a and an input of an LC network, which forms an LC-filter/resonator 14. An output of the LC filter/resonator 14 is coupled to an input of another shunt AW resonator 12b and to another matching network 20b matching an output impedance of the LC-AW-filter 20. The two series AW resonators 12a and 12b with the LC filter 14 in between form another example of the wideband filter structure 10. In this example, the further component 16 may be comprised in the shunt AW resonator 12b or in the matching network 20b.

The examples illustrated by the basic structures in FIGS. 3 and 4 show that examples of the wideband filter structure 10 may use a pi-type or T-type network comprising the acoustic resonator 12, the analog resonator 14 and the further component 16. The basic structures are shown in FIGS. 3 and 4 as a block diagrams. They are basically realized in ladder topology comprising passive elements and acoustic resonators 12a, 12b (minimum one, the Figs. show two for symmetry reasons). Theoretically, there are no limits on the LC filter/resonator 14 order. The two structures are designed complementarily to each other and therefore exhibit complementary transmission behavior. Both Figs. use external matching components 20a, 20b for matching the input and output resistance/impedance for optimized or improved transmission behavior. At least in some examples the matching may be integrated into the wideband filter structure 10 as well, which means modifying the component values to match the input and output accordingly to reduce the need for the external matching network (which may be lossy, too).

Figure 5:
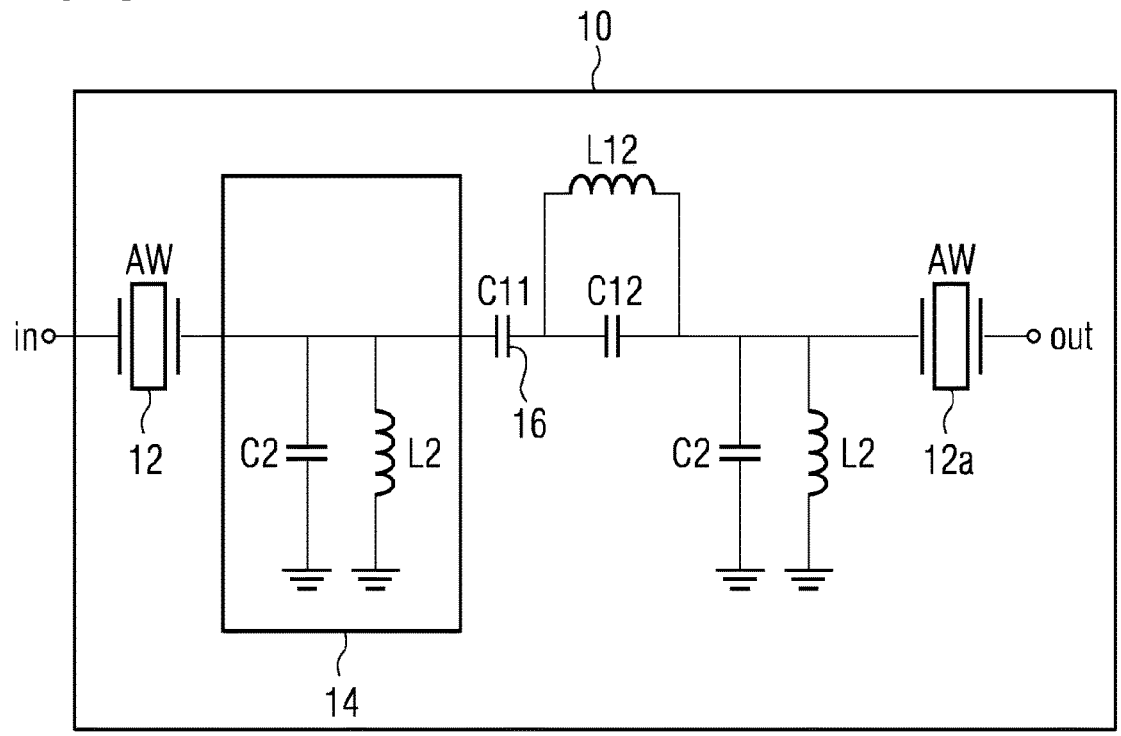
FIG. 5 shows a schematic example of a wideband filter structure.

The structure depicted in FIG. 3 includes acoustic resonators 12a, 12b in the series path (minimum 1) and therefore comprises or uses a pi-type LC network 14 in combination. The properties of the acoustic element(s) 12a, 12b account for a steep cut-off near the upper side of the passband. The structure depicted in FIG. 4 includes acoustic resonators 12a, 12b in the shunt path and therefore comprises or uses a T-type ladder LC network 14 in combination. It is to be noted that in examples such T-type or pi-type structures may form a partial or sub-circuit of an overall structure, the structure of which may be further influenced by components the partial or sub-circuit is coupled to. Hence, additional components may render the overall structure to not being strictly pi-type or T-type anymore. Various multiple concatenations of these basic structures are possible to form examples of multi-stage filters, examples of wideband filter structures 10, respectively. FIG. 5 shows a schematic example of another wideband filter structure 10 with an LC filter/resonator part of $5^{th}$ order implementing the structure shown in FIG. 3. In the example shown in FIG. 5 an acoustic resonator 12 is coupled to an analog resonator 14, which is implemented using capacitor C2 and inductance L2 (C2L2 in parallel configuration). The acoustic resonator 12 is also coupled and to a further component 16, which is implemented as C11. The example further shows another analog resonator, implemented by L12 and C12 (L12C12 in parallel configuration), which is coupled to yet another acoustic resonator 12a and another analog resonator implemented by C2 and L2 (C2L2 in parallel configuration). As can be seen from FIG. 5, resonators, C2L2, L12C12 and C2L2 are in a pi-structure together with the further component C11 16. As shown by the example of FIG. 5 the acoustic resonator 12 may be an acoustic wave resonator coupled in series to the analog resonator 14. The analog resonator 14 and the further component 16 may form a pi-type network of capacitors and inductors. The interpretation as pi-type structure in this example refers to the structure of the analog components among each other. As can be seen the acoustic resonator 12, the analog resonator 14 (C2L2) and the further component 16 (C11) are arranged in a T-type configuration, which is followed by another T-type configuration of analog resonator L12C12, analog resonator C2L2 and the further acoustic resonator 12a. In some examples matching components may be added to the structure, which may further influence the structure.

Figure 6:
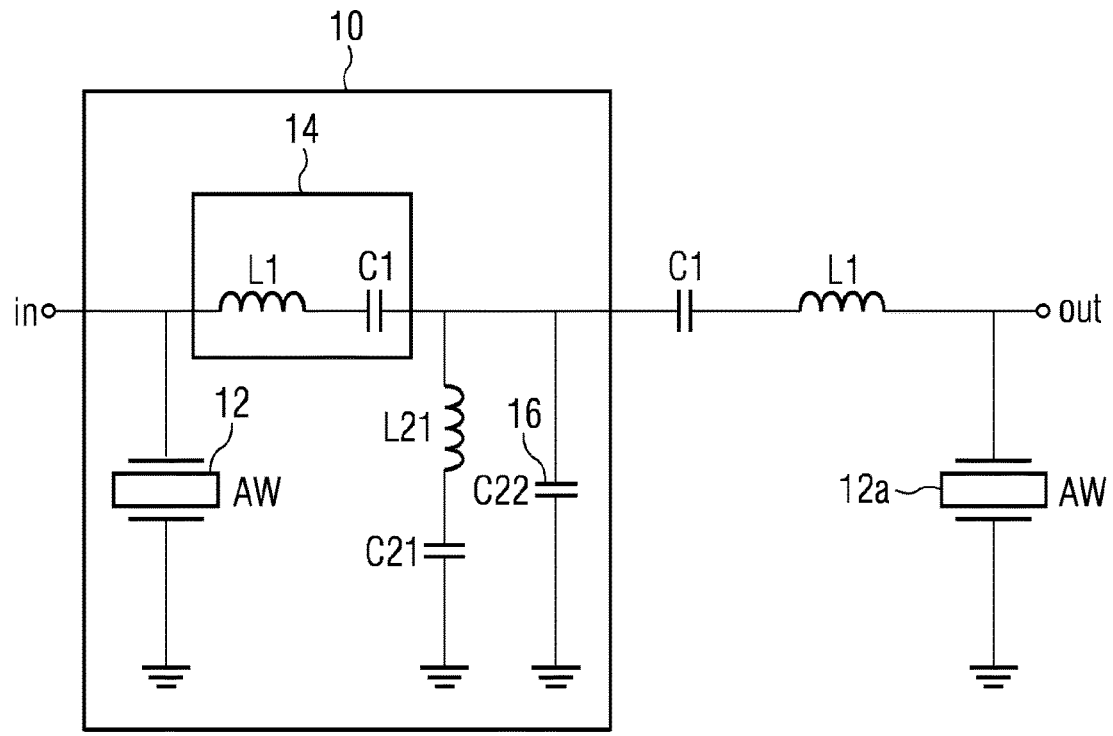
FIG. 6 shows another schematic example of a wideband filter structure.

FIG. 6 shows another schematic example of a wideband filter structure 10 with an LC filter/resonator part of $5^{th}$ order implementing the structure shown in FIG. 4. In the example shown in FIG. 6 an input of the filter structure 10 is coupled to an acoustic resonator 12 and an analog resonator 14. The acoustic resonator 12 is coupled in a shunt path to the analog resonator 14, which is implemented using inductance L1 and capacitor C1 (L1C1 in series configuration). The analog resonator 14 (C1L1) is also coupled and to a further component 16, which is implemented as C22. The example further shows another analog resonator, implemented by L21 and C21 (L21C21 in series configuration), which is coupled to yet another analog resonator implemented by C1 and L1 (C1L1 in series configuration). Another acoustic resonator 12a is coupled to the resonator C1L1 and to an output of the filter structure 10. As can be seen from FIG. 6, resonators, L1C1, L21C21 and C1L1 are in a T-structure together with the further component C22 16. In some examples matching components may be added to the structure, which may further influence the structure. As shown by the example depicted in FIG. 6 the acoustic resonator 12 may be an acoustic wave resonator coupled in a shunt path of the analog resonator 14. The analog resonator 14 and the further component 16 form a T-type network of capacitors and inductors. Again depending on the perspective and on how many components are considered, the acoustic resonator 12, the analog resonator 14 (L1C1) and the further component 16 (C22) form a pi-type configuration.

In examples a number of acoustic elements/resonators 12, 12a may depend on the desired filter skirt and stopband suppression to be reached and on the filter properties of the LC network. Examples are not limited to the order or number of elements depicted in the FIGS. 5 and 6. Asymmetry of the structure may be present in some examples.

In examples an exact realization of the LC network may depend on the overall filter requirements and may be derived by common methods of classic filter design theory. One design target may usually be a reduction of passive elements, especially inductances, and their design for realizability, which may mean minimizing or keeping moderate an LC filter order.

Figure 7:
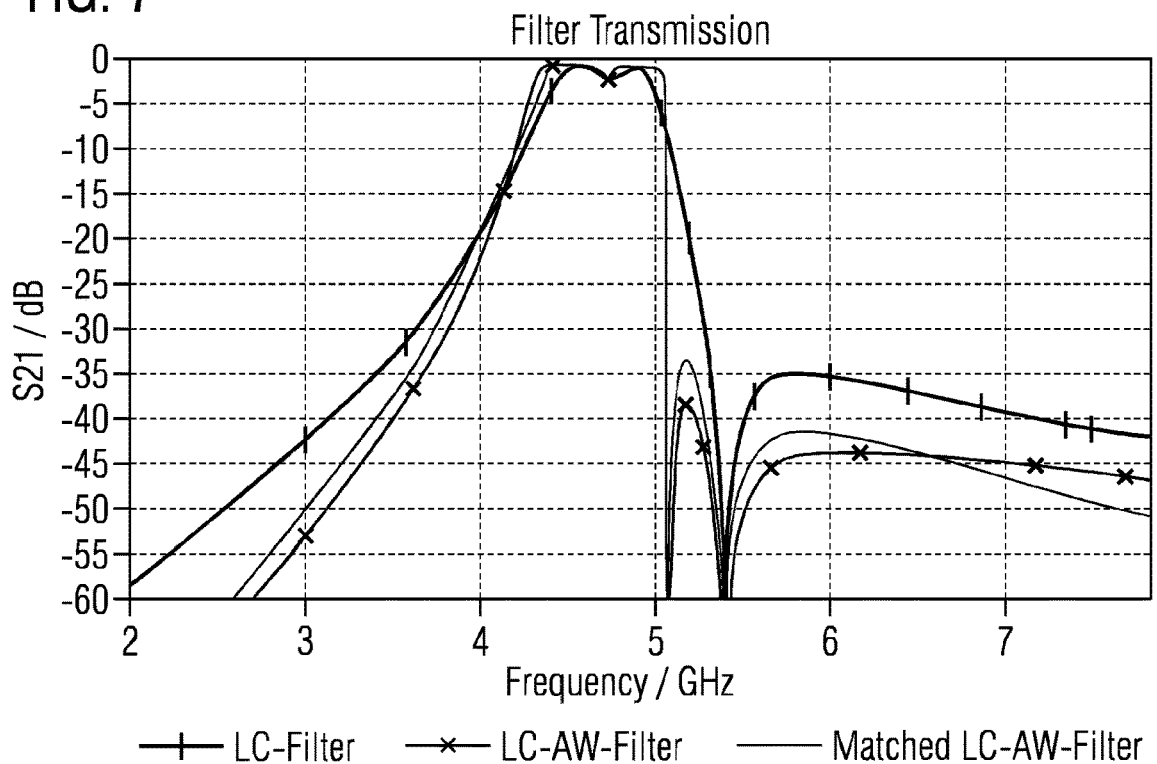
FIG. 7 shows a frequency response of an example of a wideband filter structure.

FIG. 7 shows a frequency response of an example of a wideband filter structure 10 according to FIG. 5 with an LC filter order of 5, a 3-dB bandwidth>600 MHz, and a stopband suppression improvement near steep cut-off of 15-20 dB. FIG. 7 shows a frequency response with frequency in GHz on the abscissae and insertion loss in dB on the ordinate. Three frequency responses are shown, one for the LC-filter alone (indicated by vertical markers), one for the example of an LC-AW-filter 10 (x-markers), and one for a matched LC-AW filter 20 (no marker).

Figure 8:
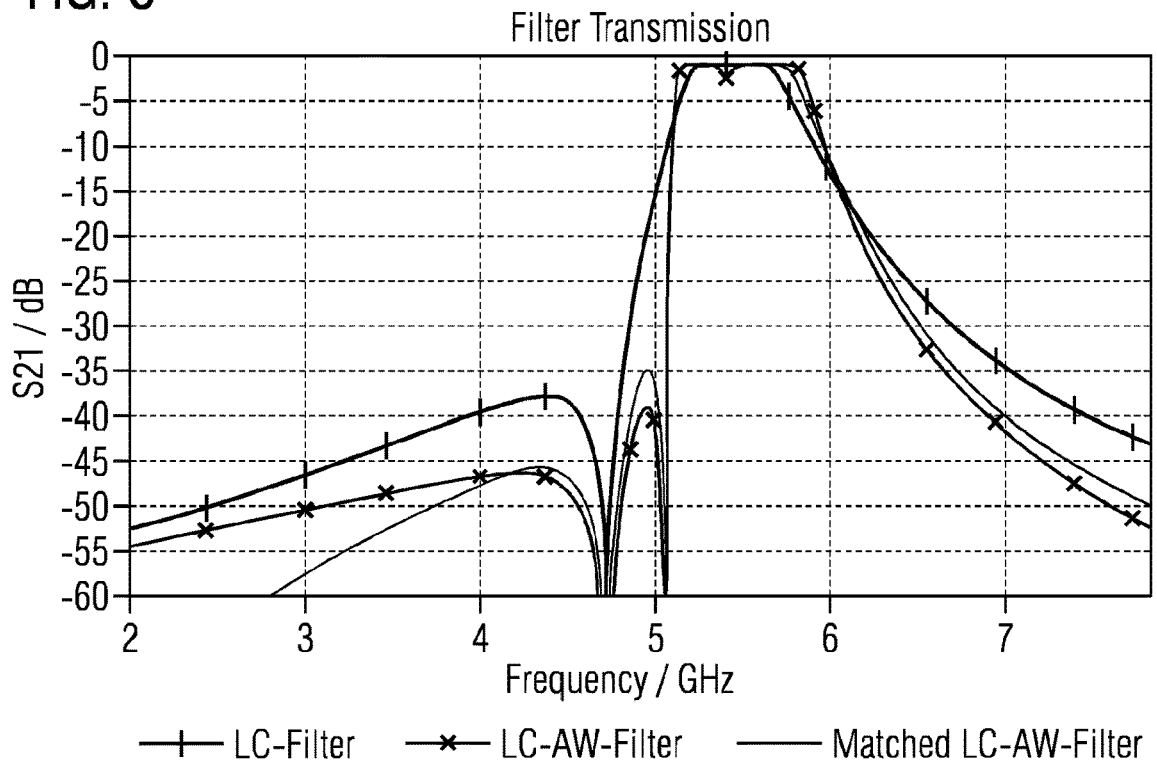
FIG. 8 shows a frequency response of another example of a wideband filter structure.

FIG. 8 shows a frequency response of another example of a wideband filter structure 10 according to FIG. 6 with an LC filter order of 5, a 3-dB bandwidth>600 MHz (LC), >700 MHz (LC-AW), and a stopband suppression improvement near steep cut-off of 15-20 dB. FIG. 8 shows a frequency response with frequency in GHz on the abscissae and insertion loss in dB on the ordinate. Three frequency responses are shown, similar to FIG. 7, one for the LC-filter alone (indicated by vertical markers), one for the example of an LC-AW-filter 10 (x-markers), and one for a matched LC-AW filter 20 (no marker).

The filter transmission of the given schematics in FIGS. 5 and 6 are further analyzed with the help of FIGS. 7 and 8. The transmission of the pure LC network (vertical markers) is depicted as well as the transmission with acoustic elements added on both sides (x-markers), and the combined network transmission with external matching components (no markers) to account for proper impedance matching. In the final example of the matched LC-AW-filter 20 realization the matching may be integrated into the LC-AW-Filter structure 20 by adjusting element values accordingly. For the simulations L-type matching circuits were used. As indicated in the above FIGS. 3 and 4, some examples further comprise at least one matching component 20a, 20b. The matching component 20a, 20b is configured to match an input or an output impedance of the wideband filter structure 10 to further components coupled to the filter 10.

As can be seen an improvement of a passband ripple is reached by slightly narrowing bandwidth and decreasing stopband suppression. By using other matching techniques both passband and stopband behavior can be improved. The resonance circuit in the series branch of the exemplary filter of FIG. 5 (L12, C12) accounts for the notch at 5.4 GHz. The two acoustic resonators 12, 12a in the series branch account for the notch near to 5 GHz (5.08 GHz) and the steep filter skirt on the upper side of the passband. A stopband suppression improvement in the range of 15-20 dB is achieved (without matching). The wide passband (>600 MHz (4.4-5 GHz), a fractional bandwidth>12%) is defined by the relation between series (L12, C12) and the shunt LC circuits (L2, C2).

By using only passive elements as shunt elements and a capacitor 16 in the series branch (C11), a smooth cut-off at the lower side of the passband and relatively high suppression (infinity at DC) is achieved. The exemplary filter of FIG. 6 is designed in a similar manner. Its behavior is complementary to that of FIG. 3, i.e. it comprises a steep cut-off at the lower edge of the passband and smooth cut-off at the upper side (FIG. 8). A stopband suppression improvement in the range of 15-20 dB is achieved (without matching) near the steep cut-off.

Due to the fact that there are only L/C elements in the series path the smooth cut-off at the upper side of the passband is achieved. The acoustic resonators 12, 12a account for the steep cut-off at the lower side of the passband and a further improvement in stopband suppression. In the example the filter 10 is scaled to comprise a transmission zero caused by the acoustic 12, 12*a* resonators at the same frequency as its complementary structure (at 5.08 GHz) and a high stopband attenuation at the passband of the other structure. The shunt elements account for the notch at 4.75 GHz (L12, C12) and at infinity (C22) and the relation between series (L1, C1) and shunt elements defines bandwidth (~700 MHz (5.12-5.82 GHz), a fractional bandwidth>12%).

Both example filters 10 show a transition band (at the steep cut-off) of roughly 50 MHz, which is only 1% relative to the cut-off frequency. Insertion loss is below 2 dB and a suppression of greater than 30 dB can easily be achieved. Further improvements of the filter responses are possible by further optimization e.g. by distinct resonator zero placement in the stopband and by advanced matching techniques (which may require more elements).

As FIGS. 7 and 8 show the wideband filter structure 10 may have a frequency response with two cut-off frequencies. A first cut-off frequency is mainly determined by the analog resonator 14 and a second cut-off frequency is determined by a resonance or anti-resonance frequency of the acoustic resonator 12. The resonance cut-off frequency of the analog filter 14 (when free running) and the corresponding cut-off frequency of the frequency response of the wideband filter structure 10, which is mainly determined by the analog filter 14, may differ by less than 10% in some examples. The resonance frequency of the analog filter 14 when implemented in the wideband filter structure 10 may be influenced by further components implemented in the same wideband filter structure 10. Dimensioning of the components, e.g. inductor and capacitors may be carried out accordingly. For example, appropriate values for the LC elements can be derived by using classic filter theory. The basic dimensions for the used acoustic resonators where taken from Jimenez Blasco, M., and scaled to their respective resonance frequency by applying dependencies reported in Campanella, H.

Figure 9:
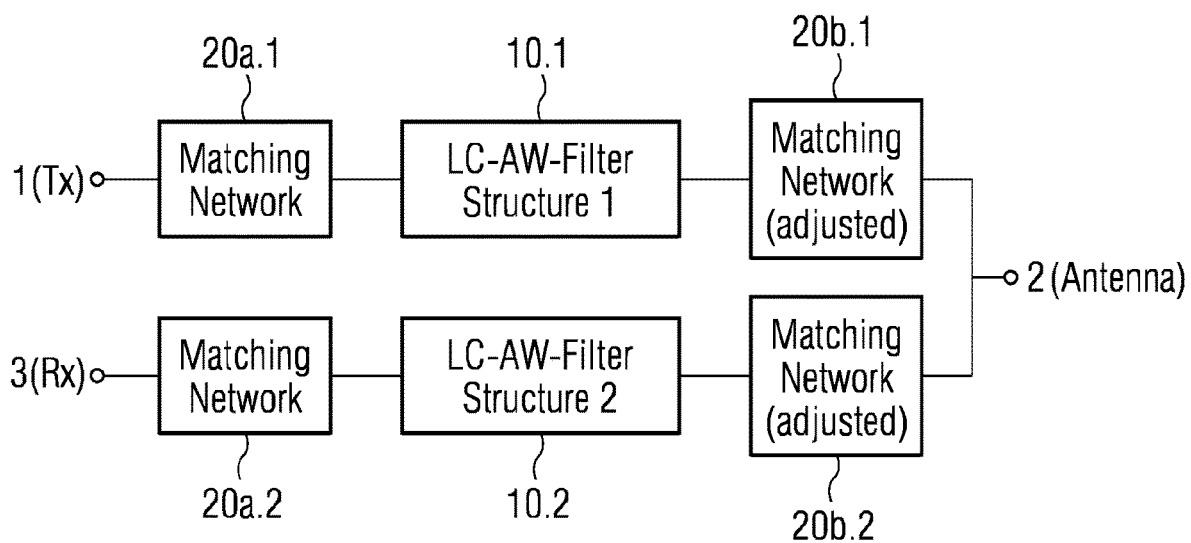
FIG. 9 depicts an example implementing a duplexer structure.

FIG. 9 depicts an example implementing a duplexer/diplexer structure using two examples 10.1 and 10.2 of the wideband filter structure. A duplexer may separate transmit (TX) and receive (RX) paths; a diplexer may separate several TX paths (or several RX paths). Examples of wideband filter structures 10 may be used for both cases, i.e. for duplexer and diplexer implementations. In one branch, e.g. a TX branch, shown at the top of FIG. 9 a matching network 20*a*.1 matches an input port 1 to the input of LC-AW-Filter structure 10.1 and another matching network 20*b*.1 matches the output of the first branch to the antenna port 2. In another branch, e.g. an RX branch, shown at the bottom a receive port 3 is matched to the input of LC-AW-Filter 10.2 by matching network 20*a*.2. Another matching network 20*b*.2 matches the output of the LC-AW-Filter 10.2 to the antenna port 2. As indicated in FIG. 9 some examples comprise at least a first filter branch and a parallel second filter branch. The first filter branch comprises a first combination 10.1 of the at least one acoustic resonator 12, the at least one analog resonator 14, and the further component 16. The second filter branch comprises a second combination of at least one further acoustic resonator 12, at least one further analog resonator 14, and another further component 16. The first and the second branches may correspond to wideband filter structures 10 according to the above examples. For example, the first filter branch may implement a low-pass or a bandpass characteristic and the second branch may implement a high-pass or another bandpass characteristic.

As shown in FIG. 9 it is possible to use both filters 10.1 and 10.2 in combination as a duplex/diplex filter in an example. Therefore, additional elements may be used or necessary to gain better control of impedance behavior at the antenna. This is common in only-AW structures, too; cf. Link, A & Warder P. An investigation on duplex applicability has been carried out, the block diagram of an example is shown in FIG. 9. The duplexer is built using both proposed filter structures in a typical combination. The matching near the antenna port 2 may be adjusted (adjusted matching networks 20*b*.1, 20*b*.2) and the single filters 10.1, 10.2 may be scaled to adjacent passbands.

Figure 10:
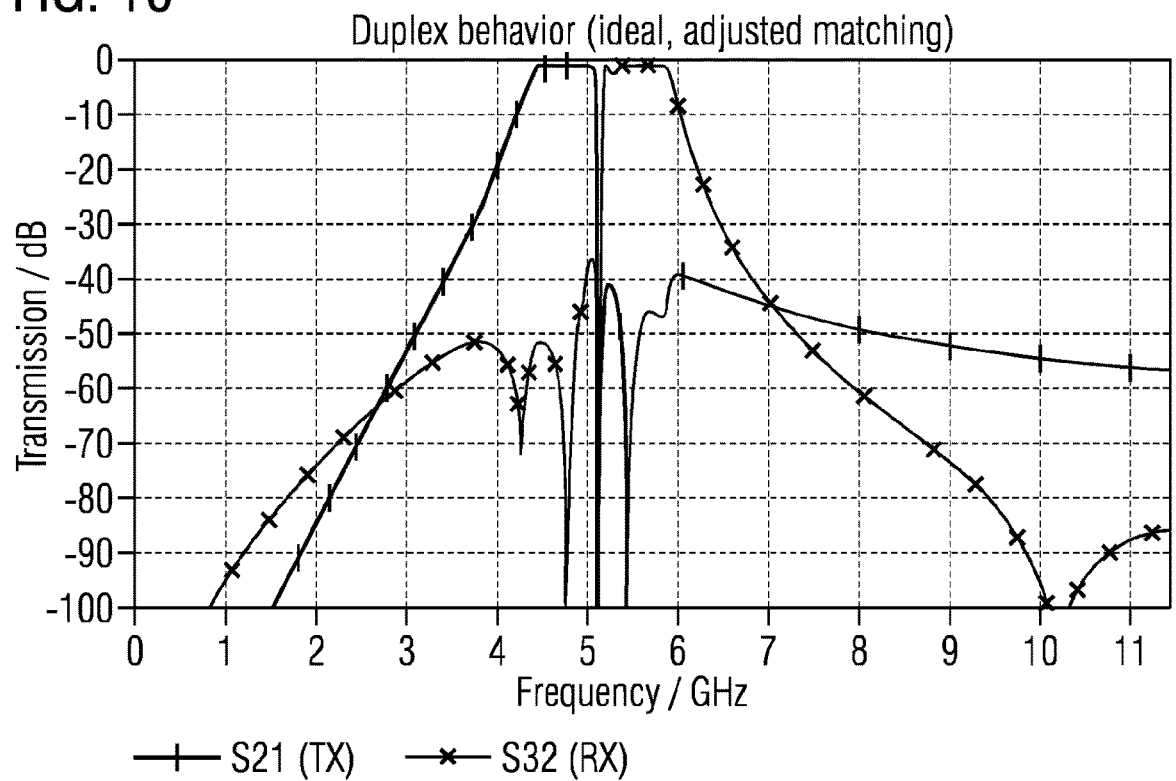
FIG. 10 shows a frequency response of an example implementing a duplexer structure.

FIG. 10 shows a frequency response of an example implementing a duplexer structure. The LC-filter part was of $5^{th}$ order, the bandwidths are 600/700 MHz (lower/upper passband. FIG. 10 shows frequency on the abscissa in GHz and insertion loss for the TX path (S21 marked with horizontal markers) and the RX path (marked with x-markers) in dB on the ordinate. The simulation result of the example schematic (ideal elements) is shown in FIG. 10. The simulation of the duplexer structure shows a suppression of at least 40 dB in mostly all of the relevant/interesting range. Since no additional optimization effort has been carried out so far, it is assumed that the duplex behavior can be further improved (e.g., by systematic placement of the additional notches created by the matching elements). The bandwidths are the same as for the single filter structures, i.e. about 600 and 700 MHz for the lower and upper passband, respectively.

Figure 11:
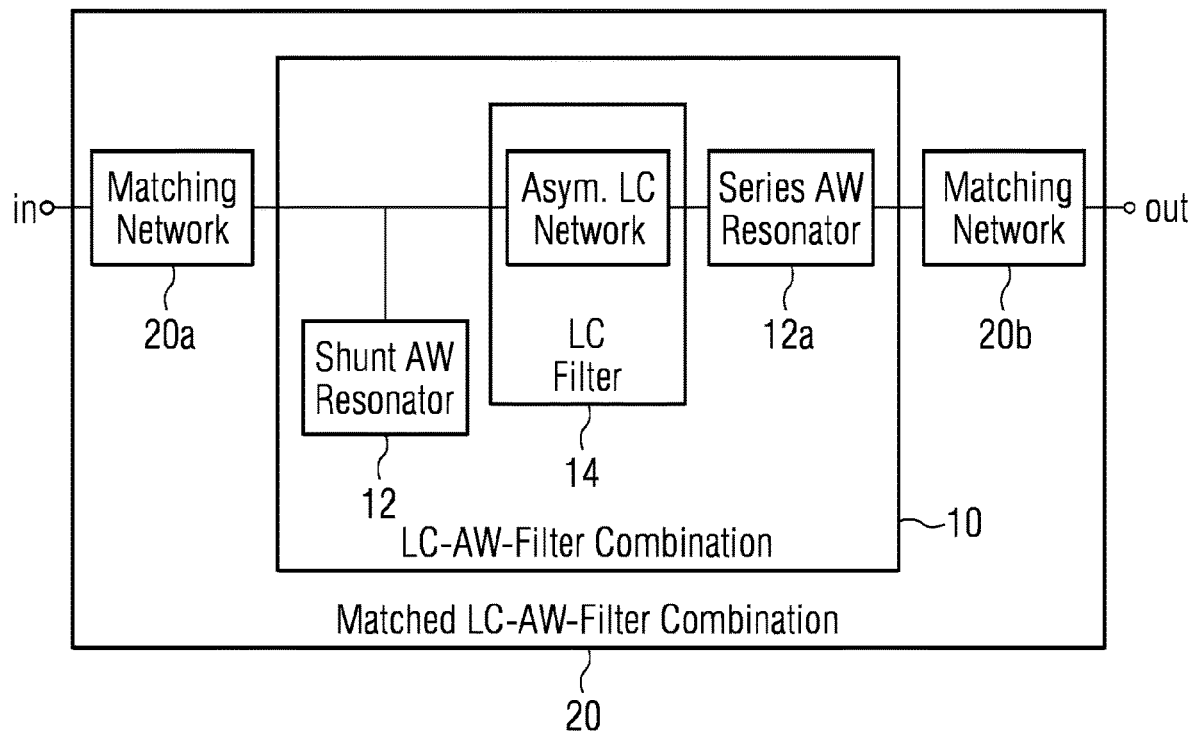
FIG. 11 depicts an example implementing a filter structure with steep filter skirts on both sides.

Another combination of both filter structures can be used to create a wide-bandwidth filter with steep filter skirts on both sides. Therefore, a new combined asymmetric filter structure is derived as an example, which is shown in FIG. 11. FIG. 11 depicts an example implementing a filter structure 10 with steep filter skirts on both sides. The matched LC-AW-Filter combination 20 comprises a first matching network 20*a* for input impedance matching in line with what is described above. The LC-AW-Filter combination 10 comprises an acoustic resonator 12 in shunt configuration with an analog resonator/filter 14 (asymmetric LC network). Another acoustic wave resonator 12*a* is coupled in series with the LC-Filter/resonator 12. Another matching network 20*b* matches the output impedance in line with the above description. The inner LC network 12 generally may be composed of arbitrary order and may also be as simple as a single half-section (L-type) or a concatenation of multiple sections. In examples, concatenations of this structure are possible as well as modifications like e.g. mirrored application.

Figure 12:
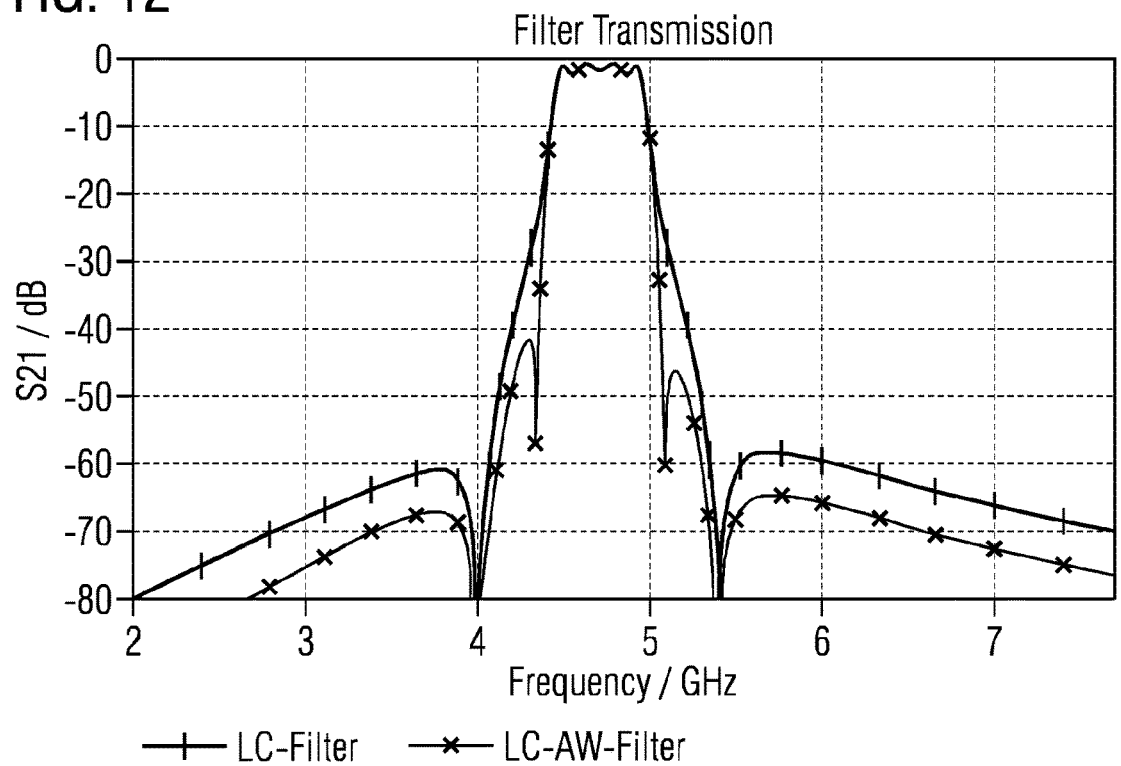
FIG. 12 depicts a frequency response of an example implementing a filter structure with steep filter skirts on both sides using an analog filter of the order of 10.

FIG. 12 depicts a frequency response of an example implementing a filter structure 10 with steep filter skirts on both sides using an analog filter/resonator 14 of the order of 10. In line with the previous Figs., FIG. 12 shows frequency in GHz on the abscissa and insertion loss in dB on the ordinate. Simulation results of an exemplary implementation of a combined structure (FIG. 11) with an LC filter order of 10 show 3 dB-bandwidth>500 MHz and a stopband suppression improvement on both sides: 6 dB (far off passband)-10 dB (near cutoff). In FIG. 12 simulation results of an exemplary implementation of such a structure are shown. In this example, the LC filter consists of two concatenated half-sections comprising five passive elements each. The simulation results (ideal elements, no matching) show that by adding a shunt 12 and a series AW resonator 12*a*, the transmission behavior of the filter 10 (x-markers) can be improved in several ways. The improvements compared to the LC-only filter (vertical markers in FIG. 12) include: little less ripple (compensation by matching still necessary), slightly wider bandwidth, steeper filter skirt on both sides (smaller transition band), and higher stopband suppression (6-10 dB here).

Figure 13:
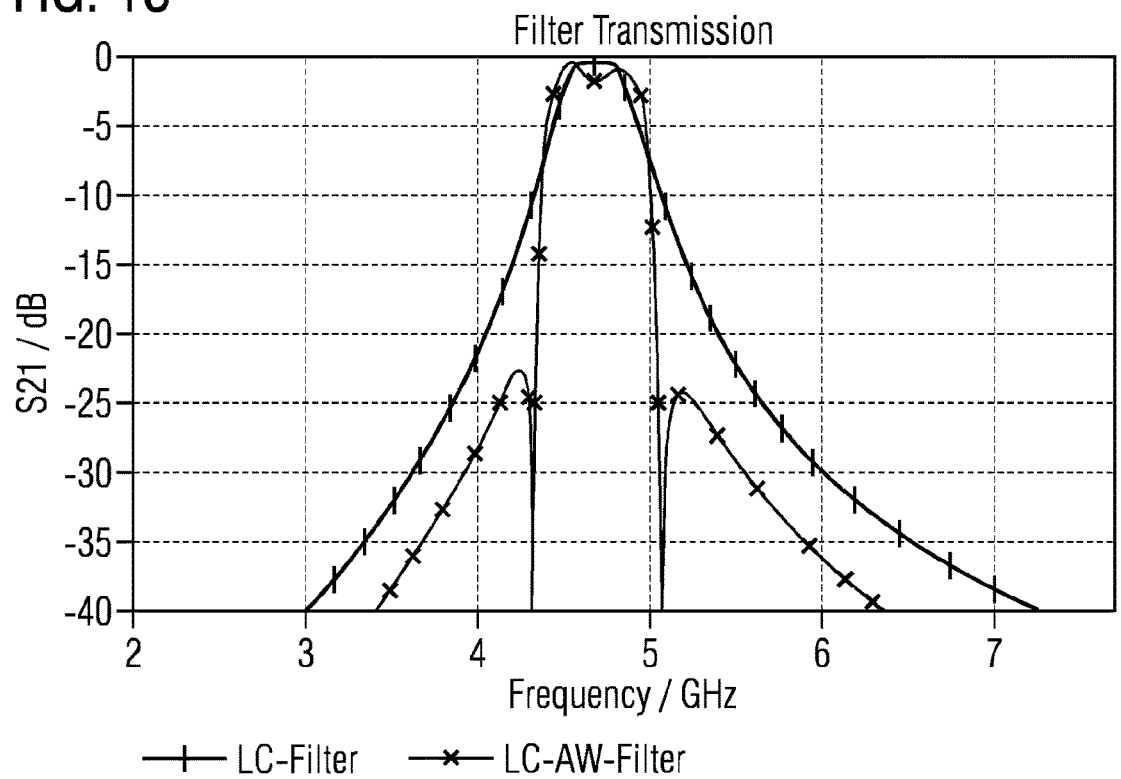
FIG. 13 depicts a frequency response of an example implementing a filter structure with steep filter skirts on both sides using an analog filter of the order of 4.

The aforementioned improvements may be considered independent of the LC filter order (relatively) and therefore they may be applicable to arbitrary complex LC structures. As a further example the same approach of FIG. 11 with a lower LC filter order of 4 is depicted in FIG. 13. FIG. 13 depicts a frequency response (in GHz on the abscissa, insertion loss in dB on the ordinate) of an example implementing a filter structure 10 with steep filter skirts on both sides using an analog filter 14 of the order of 4. Again simulation results on the LC-Filter characteristic when running free (vertical markers) are compared to the frequency response of the example wideband structure 10 (x-markers).

Figure 14:
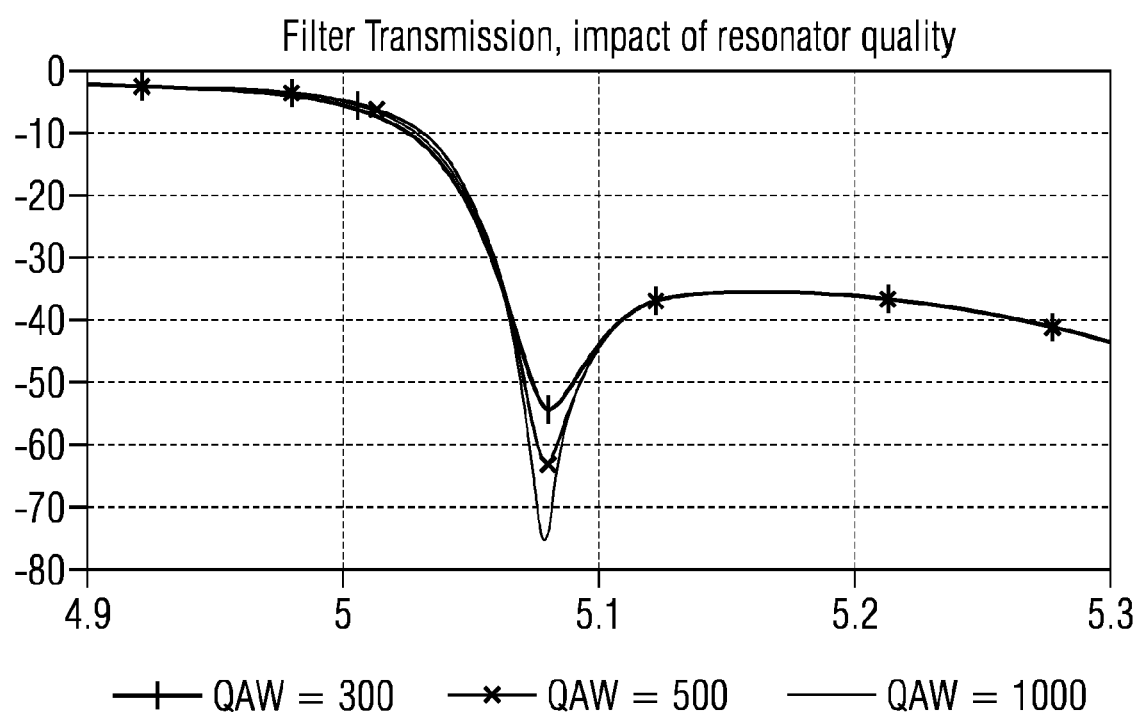
FIG. 14 illustrates an impact of resonator quality on transmission behavior in an example.

It can be observed that while the overall behavior is different (esp. regarding stopband attenuation) basically the same improvements are achieved (except for less ripples, which can be adjusted in a later step by proper impedance matching). Since there are passive LC-elements and acoustic resonators an investigation on the impact of their respective quality factors has been carried out. The overall behavior strongly depends on the quality of the used passive non-acoustic elements, especially the inductors. Simulation results for the investigation on the quality factor of the acoustic resonators are plotted in FIG. 14, for example filters shown in FIGS. 5 and 7, assuming an inductance quality factor of 100 (at 5 GHz) and perfect impedance matching. FIG. 14 illustrates an impact of acoustic resonator quality on transmission behavior in an example. FIG. 14 shows a frequency response (in GHz) of the filter structure on the abscissa and the transmission characteristic on the ordinate. FIG. 14 shows three frequency responses for three different quality factors of the acoustic resonator (QAW), namely QAW=300 (vertical marker), QAW=500 (x-marker) and QAW=1000 (no marker).

The impact of the acoustic resonators' quality factor is limited to the respective passband edge and the notch they are creating. With feasible component values the structures can be integrated into a single chip, e.g. by using standard silicon technology with aluminum nitride (AlN) as the piezoelectric material for the acoustic resonators (e.g. BAW) and integrated passive elements. Other options are using external inductances as e.g. the integration of inductances in a separate substrate (e.g. laminate) where the chip containing the other elements is mounted on or the use of separate SMD inductors, which usually comprise higher quality.

Figure 15:
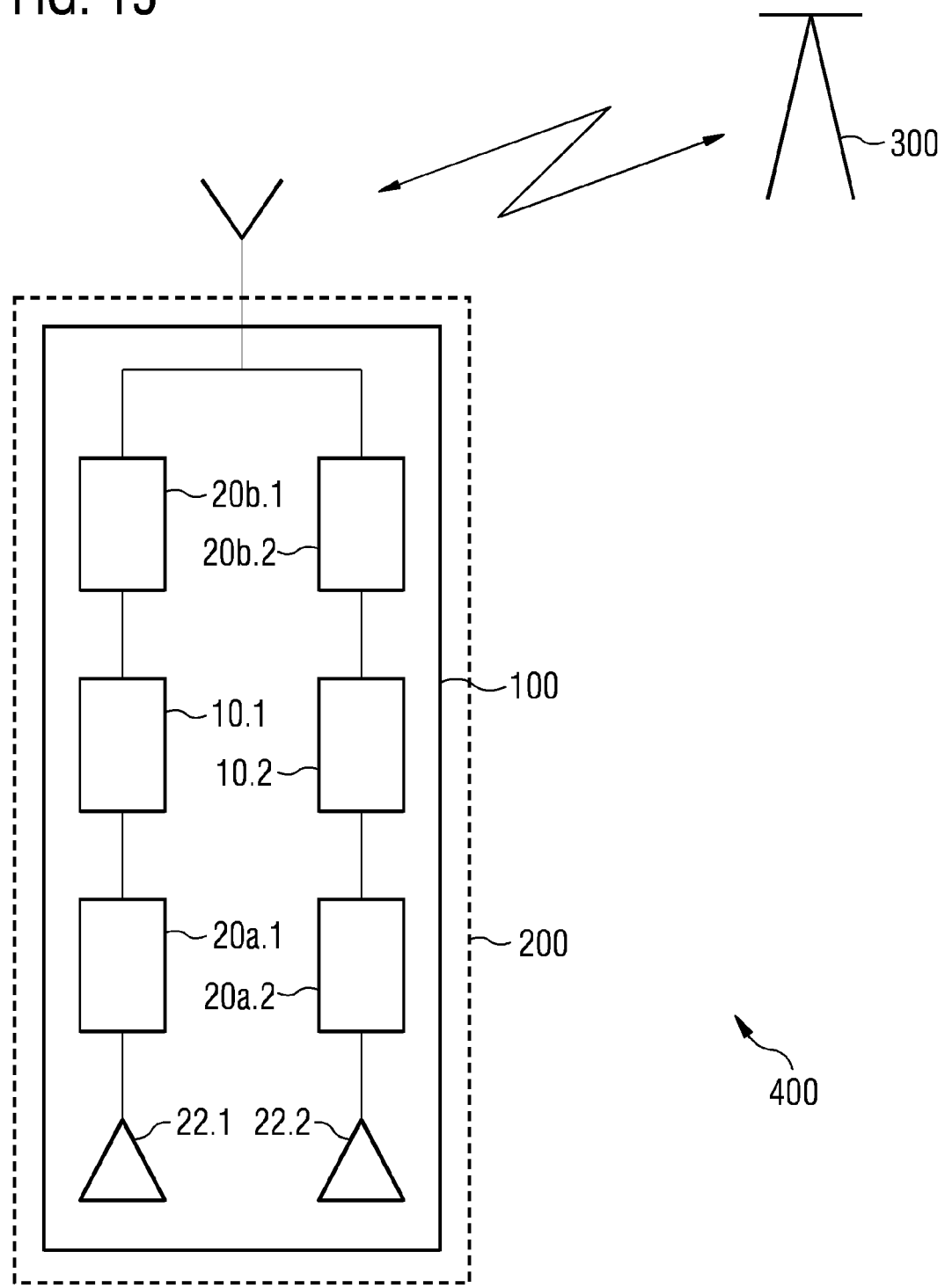
FIG. 15 shows examples of a mobile communication system, a radio transceiver, a mobile terminal, and a base station transceiver.

FIG. 15 shows examples of a mobile communication system 400, a radio transceiver 100, a mobile terminal 200, and a base station transceiver 300. Examples also provide a radio transceiver 100 comprising a wideband filter structure 10 according to the above description. As shown in FIG. 15 the radio transceiver may, for example, comprise the structure as described in FIG. 9, in which the RX branch is coupled to a receive amplifier, e.g. a Low-Noise-Amplifier 22.2, and in which the TX branch is coupled to a transmit amplifier, e.g. a Power Amplifier (PA) 22.1. Generally, an example of the radio transceiver 100 may comprise an antenna coupled to the wideband filter structure 10, 10.2 using a first matching network 20$b$.2, further comprising a receive amplifier 22.2 coupled to the wideband filter structure 10, 10.1 using a second matching network 20$a$.2, and further comprising a transmit amplifier 22.1 coupled to the wideband filter structure 10, 10.1 using a third matching network 20$a$.1, to the antenna using matching network 20$b$.1, respectively. Examples further provide a mobile terminal 200 comprising an example of the radio transceiver 100, a base station transceiver 300 comprising an example of the radio transceiver 100, and a mobile communication system 400 comprising a mobile terminal 200, a base station transceiver 300, or both.

Such a mobile communication system 400 may correspond, for example, to one of the Third Generation Partnership Project (3GPP)-standardized mobile communication networks, where the term mobile communication system is used synonymously to mobile communication network. The mobile or wireless communication system 400 may correspond to a mobile communication system of the 5th Generation (5G) and may use mm-Wave technology. The mobile communication system 400 may correspond to or comprise, for example, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN), or mobile communication networks with different standards, for example, a Worldwide Interoperability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

A base station 300 or base station transceiver 300 can be operable to communicate with one or more active mobile transceivers or terminals 200 and a base station transceiver can be located in or adjacent to a coverage area of another base station transceiver, e.g. a macro cell base station transceiver or small cell base station transceiver. Hence, examples may provide a mobile communication system 400 comprising one or more mobile transceivers 200 and one or more base station transceivers 300, wherein the base station transceivers may establish macro cells or small cells, as e.g. pico-, metro-, or femto cells. A mobile transceiver 200 may correspond to a smartphone, a cell phone, user equipment, a laptop, a notebook, a personal computer, a Personal Digital Assistant (PDA), a Universal Serial Bus (USB)-stick, a car, etc. A mobile transceiver 200 may also be referred to as UE (User Equipment) or mobile in line with the 3GPP terminology.

A base station transceiver 300 can be located in the fixed or stationary part of the network or system. A base station transceiver 300 may correspond to a remote radio head, a transmission point, an access point, a macro cell, a small cell, a micro cell, a femto cell, a metro cell, etc. A base station transceiver 300 can be a wireless interface of a wired network, which enables transmission of radio signals to a UE or mobile transceiver 200. Such a radio signal may comply with radio signals as, for example, standardized by 3GPP or, generally, in line with one or more of the above listed systems. Thus, a base station transceiver 300 may correspond to a NodeB, an eNodeB, a Base Transceiver Station (BTS), an access point, a remote radio head, a transmission point, a relay station, etc., which may be further divided into a remote unit and a central unit.

Figure 16:
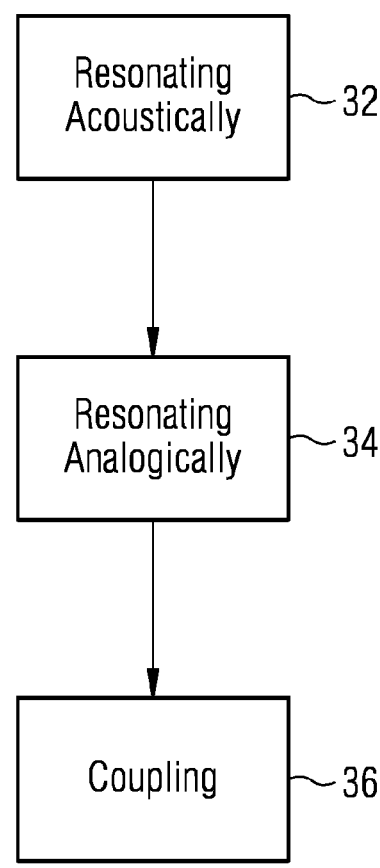
FIG. 16 depicts a block diagram of an example of a method for wideband filtering a radio signal.

FIG. 16 depicts a block diagram of an example of a method for wideband filtering a radio signal. The method comprises resonating 32 acoustically, resonating 34 analogically, and coupling 36 the analogically resonating, the acoustically resonating, and a further component.

The examples as described herein may be summarized as follows:

Example 1 is a wideband filter structure (10) for a radio signal comprising a combination of at least one acoustic resonator (12) and at least one analog resonator (14), wherein the acoustic resonator (12) is coupled to the analog resonator (14), wherein the wideband filter structure (10) comprises a further component (16), which is coupled to the combination of the acoustic resonator (12) and the analog resonator (14).

Example 2 is the wideband filter structure (10) of example 1, wherein the analog resonator (14) is a circuit comprising at least one capacitor and at least one inductor, and wherein the further component (16) comprises at least one of a capacitor or an inductor.

Example 3 is the wideband filter structure (10) of one of the examples 1 or 2, wherein the acoustic resonator (12) corresponds to one of or a combination of the elements of the group of a surface acoustic wave resonator, a bulk acoustic wave resonator, a crystal resonator, or a film bulk acoustic wave resonator.

Example 4 is the wideband filter structure (10) of one of the examples 1 to 3, comprising a filter characteristic according to one or more elements of the group of a duplexer, a diplexer, a multiplexer, a low-pass, a high-pass, a bandpass, a bandstop, or an allpass.

Example 5 is the wideband filter structure (10) of one of the examples 1 to 4, wherein the acoustic resonator (12) is operative without a parallel inductive network.

Example 6 is the wideband filter structure (10) of one of the examples 1 to 5, using a pi-type or T-type network comprising the acoustic resonator (12), the analog resonator (14) and the further component (16).

Example 7 is the wideband filter structure (10) of one of the examples 1 to 5, wherein the acoustic resonator (12) is an acoustic wave resonator coupled in series to the analog resonator (14), wherein the acoustic resonator (12), the analog resonator (14) and the further component (16) form a T-type network, wherein one of the acoustic resonator (12) and the further component (16) is coupled to an input of the wideband filter structure (10).

Example 8 is the wideband filter structure (10) of one of the examples 1 to 5, wherein the acoustic resonator (12) is an acoustic wave resonator coupled in a shunt path of the analog resonator (14), wherein the acoustic resonator (12), the analog resonator (14) and the further component (16) form a pi-type network, wherein the acoustic resonator (12) and the analog resonator (14) are both coupled to one of an input or an output of the wideband filter structure (10).

Example 9 is the wideband filter structure (10) of one of the examples 1 to 8, comprising at least a first filter branch and a parallel second filter branch, wherein the first filter branch comprises a first combination of the at least one acoustic resonator (12), the at least one analog resonator (14), and the further component (16), and wherein the second filter branch comprises a second combination of at least one further acoustic resonator (12), at least one further analog resonator (14), and another further component (16).

Example 10 is the wideband filter structure (10) of example 9, wherein the first filter branch implements a low-pass or a bandpass characteristic and wherein the second branch implements a high-pass or another bandpass characteristic.

Example 11 is the wideband filter structure (10) of one of the examples 1 to 10, further comprising at least one matching component (20a; 20b), wherein the matching component (20a; 20b) is configured to match an input or an output impedance of the wideband filter structure (10) to further components coupled to the wideband filter structure (10).

Example 12 is the wideband filter structure (10) of one of the examples 1 to 11, having a frequency response with two cut-off frequencies, wherein a first cut-off frequency is mainly determined by the analog resonator (14) and a second cut-off frequency is determined by a resonance or anti-resonance frequency of the acoustic resonator (12).

Example 13 is a wideband filter apparatus (10) for a radio signal comprising a combination of means for acoustically resonating (12) and means for analogically resonating (14), wherein the means for acoustically resonating (12) is coupled to the means for analogically resonating (14), wherein the wideband filter apparatus (10) comprises a further component (16), which is coupled to the combination of the means for acoustically resonating (12) and the means for analogically resonating (14).

Example 14 is the wideband filter apparatus (10) of example 13, wherein the means for analogically resonating (14) comprises at least one capacitor and at least one inductor, and wherein the further component (16) comprises at least one of a capacitor or an inductor.

Example 15 is the wideband filter apparatus (10) of one of the examples 13 or 14, wherein the means for acoustically resonating (12) corresponds to one of or a combination of the elements of the group of a surface acoustic wave resonator, a bulk acoustic wave resonator, a crystal resonator, or a film bulk acoustic wave resonator.

Example 16 is the wideband filter apparatus (10) of one of the examples 13 to 15, comprising a filter characteristic according to one or more elements of the group of a duplexer, a diplexer, a multiplexer, a low-pass, a high-pass, a bandpass, a bandstop, or an allpass.

Example 17 is the wideband filter apparatus (10) of one of the examples 13 to 16, wherein the means for acoustically resonating (12) is operative without a parallel inductive network.

Example 18 is the wideband filter apparatus (10) of one of the examples 13 to 17, using a pi-type or T-type network comprising the means for acoustically resonating (12), the means for analogically resonating (14) and the further component (16).

Example 19 is the wideband filter apparatus (10) of one of the examples 13 to 17, wherein the means for acoustically resonating (12) is an acoustic wave resonator coupled in series to the means for analogically resonating (14), wherein the means for acoustically resonating (12), the means for analogically resonating (14), and the further component (16) form a T-type network, wherein one of the means for acoustically resonating (12) and the further component (16) is coupled to an input of the wideband filter apparatus (10).

Example 20 is the wideband filter apparatus (10) of one of the examples 13 to 17, wherein the means for acoustically resonating (12) is an acoustic wave resonator coupled in a shunt path of the means for analogically resonating (14), wherein the means for acoustically resonating (12), the means for analogically resonating (14) and the further component (16) form a pi-type network, wherein the means for acoustically resonating (12) and the means for analogically resonating (14) are both coupled to one of an input or an output of the wideband filter structure (10).

Example 21 is the wideband filter apparatus (10) of one of the examples 13 to 20, comprising at least a first filter branch and a parallel second filter branch, wherein the first filter branch comprises a first combination of the at least means for acoustically resonating (12), the means for analogically resonating (14), and the further component (16), and wherein the second filter branch comprises a second combination of means for acoustically resonating (12), further means for analogically resonating (14), and another further component (16).

Example 22 is the wideband filter apparatus (10) of example 21, wherein the first filter branch implements a low-pass or a bandpass characteristic and wherein the second branch implements a high-pass or another bandpass characteristic.

Example 23 is the wideband filter apparatus (10) of one of the examples 13 to 22, further comprising means for matching (20a; 20b), wherein the means for matching (20a; 20b) is configured for matching an input or an output impedance of the wideband filter apparatus (10) to further components coupled to the wideband filter apparatus (10).

Example 24 is the wideband filter apparatus (10) of one of the examples 13 to 23, having a frequency response with two cut-off frequencies, wherein a first cut-off frequency is mainly determined by means for analogically resonating (14) and a second cut-off frequency is determined by a resonance or anti-resonance frequency of the means for acoustically resonating (12).

Example 25 is a radio transceiver comprising a wideband filter structure (10) according to one of the examples 1 to 12 or the wideband filter apparatus (10) according to one of the examples 13 to 24.

Example 26 is the radio transceiver of example 25, comprising an antenna coupled to the wideband filter apparatus or structure (10) using a first matching network (20b.1), further comprising a receive amplifier (22.2) coupled to the wideband filter apparatus or structure (10) using a second matching network (20a.2), and further comprising a transmit amplifier (22.1) coupled to the wideband filter apparatus or structure (10) using a third matching network (20a.1).

Example 27 is a mobile terminal (200) comprising the radio transceiver (100) of one of the examples 25 or 26.

Example 28 is a method for wideband filtering a radio signal, the method comprising resonating (32) acoustically; resonating (34) analogically; and coupling (36) the analogically resonating, the acoustically resonating, and a further component.

Example 29 is the method of example 28, comprising generating a filter characteristic according to one or more elements of the group of a duplexer, a diplexer, a multiplexer, a low-pass, a high-pass, a bandpass, a bandstop, or an allpass.

Example 30 is the method of one of the examples 28 or 29, further comprising using a pi-type or T-type network acoustically resonating and analogically resonating.

Example 31 is the method of example 30, using the analogically resonating and the further component for forming a pi-type network of capacitors and inductors.

Example 32 is the method of one of the examples 28 to 31, using at least a first filter branch and a parallel second filter branch, wherein the first filter branch comprises acoustically resonating, analogically resonating, and the further component, and wherein the second filter branch comprises further acoustically resonating, further analogically resonating, and another further component.

Example 33 is the method of example 32, wherein the first filter branch implements a low-pass or a bandpass characteristic and wherein the second branch implements a high-pass or another bandpass characteristic.

Example 34 is the method of one of the examples 28 to 33, further comprising matching (20a; 20b), wherein the matching (20a; 20b) is configured for matching an input or an output impedance of a wideband filter apparatus (10) to further components coupled to the wideband filter apparatus (10).

Example 35 is the method of one of the examples 28 to 34 having a frequency response with two cut-off frequencies, wherein a first cut-off frequency is mainly determined by analogically resonating and a second cut-off frequency is determined by a resonance or anti-resonance frequency of acoustically resonating.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for resonating", "means for coupling", etc., may be implemented in the form of dedicated hardware, such as "a resonator", "a coupler", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A wideband filter structure for a radio signal comprising a combination of at least one acoustic resonator and at least one analog resonator,
    wherein the at least one acoustic resonator is coupled in series to the at least one analog resonator,
    wherein the wideband filter structure comprises a further component that is coupled to the combination of the at least one acoustic resonator and the at least one analog resonator to form a T-type network,
    wherein one of the at least one acoustic resonator and the further component is coupled to an input of the wideband filter structure.

2. The wideband filter structure of claim 1, wherein the at least one analog resonator is a circuit comprising at least one capacitor and at least one inductor, and wherein the further component comprises at least one of a further capacitor or a further inductor.

3. The wideband filter structure of claim 1, wherein the at least one acoustic resonator corresponds to one of or a combination of a surface acoustic wave resonator, a bulk acoustic wave resonator, a crystal resonator, or a film bulk acoustic wave resonator.

4. The wideband filter structure of claim 1, comprising a filter characteristic according to one or more elements of a duplexer, a diplexer, a multiplexer, a low-pass, a high-pass, a bandpass, a bandstop, or an allpass.

5. The wideband filter structure of claim 1, wherein the at least one acoustic resonator is operative without a parallel inductive network.

6. The wideband filter structure of claim 1, comprising
    at least a first filter branch and a parallel second filter branch,
        wherein the first filter branch comprises a first combination of the at least one acoustic resonator, the at least one analog resonator, and the further component, and
        wherein the second filter branch comprises a second combination of at least one second acoustic resonator, at least one second analog resonator, and second further component.

7. The wideband filter structure of claim 6, wherein the first filter branch implements a low-pass or a bandpass characteristic and wherein the second branch implements a high-pass or a second bandpass characteristic.

8. The wideband filter structure of claim 1, further comprising at least one matching component, wherein the at least one matching component is configured to match an input or an output impedance of the wideband filter structure to the further component coupled to the wideband filter structure.

9. The wideband filter structure of claim 1, having a frequency response with two cut-off frequencies, wherein a first cut-off frequency is determined by the at least one analog resonator and a second cut-off frequency is determined by a resonance or anti-resonance frequency of the at least one acoustic resonator.

10. A radio transceiver comprising a wideband filter structure according to claim 1.

11. The radio transceiver of claim 10, comprising an antenna coupled to the wideband filter or structure using a first matching network, further comprising a receive amplifier coupled to the wideband filter structure using a second matching network, and further comprising a transmit amplifier coupled to the wideband filter structure using a third matching network.

12. A mobile terminal comprising the radio transceiver of claim 10.

13. A wideband filter structure for a radio signal comprising a combination of at least one acoustic wave resonator and at least one analog resonator,
    wherein the at least one acoustic resonator is an acoustic wave resonator coupled in a shunt path of the at least one analog resonator,
    wherein the wideband filter structure comprises a further component that is coupled to the combination of the at least one acoustic resonator and the at least one analog resonator,
    wherein the acoustic resonator, the analog resonator and the further component form a pi-type network, wherein the at least one acoustic resonator and the at least one analog resonator are both coupled to one of an input or an output of the wideband filter structure.

14. A method for wideband filtering a radio signal, the method comprising
    resonating acoustically;
    resonating analogically;
    coupling the analogically resonating and the acoustically resonating in a series;
    coupling the series with a further component in a network that is a T-type network.

15. The method of claim 14, comprising generating a filter characteristic according to one or more elements of a duplexer, a diplexer, a multiplexer, a low-pass, a high-pass, a bandpass, a bandstop, or an allpass.

16. The method of claim 14, using at least a first filter branch and a parallel second filter branch, wherein the first filter branch comprises the acoustically resonating, the analogically resonating, and the further component, and wherein the second filter branch comprises a further acoustically resonating, a further analogically resonating, and another further component.

17. The method of claim 16, wherein the first filter branch implements a low-pass or a bandpass characteristic and wherein the second branch implements a high-pass or another bandpass characteristic.

18. The method of claim 14, further comprising matching, wherein the matching is configured for matching an input or an output impedance of a wideband filter apparatus to the further component coupled to the wideband filter apparatus.

19. The method of claim 14 having a frequency response with two cut-off frequencies, wherein a first cut-off frequency is mainly determined by analogically resonating and a second cut-off frequency is determined by a resonance or anti-resonance frequency of acoustically resonating.

\* \* \* \* \*